US 11,366,184 B2

(12) United States Patent
Eitel et al.

(10) Patent No.: US 11,366,184 B2
(45) Date of Patent: Jun. 21, 2022

(54) POSITION DETERMINATION DEVICE AND METHOD

(71) Applicant: Sony Semiconductor Solutions Corporation, Atsugi (JP)

(72) Inventors: Ben Eitel, Stuttgart (DE); Daniel Schneider, Stuttgart (DE); Mark Veltman, Stuttgart (DE)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 297 days.

(21) Appl. No.: 16/004,606

(22) Filed: Jun. 11, 2018

(65) Prior Publication Data

US 2018/0356475 A1 Dec. 13, 2018

(30) Foreign Application Priority Data

Jun. 13, 2017 (EP) .................................. 17175725

(51) Int. Cl.
| | |
|---|---|
| *G01R 33/10* | (2006.01) |
| *G01R 33/02* | (2006.01) |
| *G01C 21/20* | (2006.01) |
| *G01C 21/16* | (2006.01) |

(52) U.S. Cl.
CPC ........... *G01R 33/10* (2013.01); *G01C 21/165* (2013.01); *G01C 21/206* (2013.01); *G01R 33/0206* (2013.01)

(58) Field of Classification Search
None
See application file for complete search history.

(56) References Cited

U.S. PATENT DOCUMENTS

| 9,167,440 B2 * | 10/2015 | Kim ..................... G01C 21/165 |
| 2007/0210927 A1 * | 9/2007 | Domeier ................ G01C 17/30 340/573.2 |
| 2011/0294517 A1 | 12/2011 | Hahm |
| 2012/0143495 A1 | 6/2012 | Dantu |

(Continued)

FOREIGN PATENT DOCUMENTS

| CN | 102692608 A | 9/2012 |
| CN | 103148848 A | 6/2013 |

(Continued)

OTHER PUBLICATIONS

Wroble, Kyle, "Performance Analysis of Magnetic Indoor Local Positioning System" (2015).Master's Theses. 609. https://scholarworks.wmich.edu/masters_theses/609 (Year: 2015).*

*Primary Examiner* — Lina M Cordero
(74) *Attorney, Agent, or Firm* — Xsensus LLP

(57) ABSTRACT

A position determination device comprises data input circuitry configured to obtain magnetic field sensor data sensed by a magnetic field sensor, detection circuitry configured to detect temporal variations of the magnetic field and to generate temporal variation information indicating the detected temporal variation of the magnetic field, and magnetic fingerprinting circuitry configured to determine a first position estimate of the sensor position by comparing the obtained magnetic field sensor data with a magnetic map comprising magnetic fingerprints of a region around the magnetic field sensor and using the generated temporal variation information.

16 Claims, 5 Drawing Sheets

(56) References Cited

U.S. PATENT DOCUMENTS

| | | | | |
|---|---|---|---|---|
| 2013/0150076 A1* | 6/2013 | Kim | ...................... | H04W 24/00 455/456.1 |
| 2013/0177208 A1* | 7/2013 | Haverinen | .............. | G06F 17/16 382/103 |
| 2013/0310069 A1* | 11/2013 | Haverinen | ............. | G01C 21/08 455/456.1 |
| 2014/0286534 A1 | 9/2014 | Haverinen | | |
| 2014/0312884 A1* | 10/2014 | Reilio | ....................... | G01P 3/42 324/207.11 |
| 2014/0320121 A1* | 10/2014 | Perttunen | ............. | G06Q 20/102 324/244 |
| 2015/0018018 A1* | 1/2015 | Shen | .................... | G01C 21/005 455/457 |
| 2015/0106373 A1 | 4/2015 | Haverinen | | |
| 2015/0153151 A1* | 6/2015 | Kochanski | ............ | G01B 7/004 702/150 |
| 2016/0116290 A1 | 4/2016 | Haverinen | | |
| 2016/0187134 A1* | 6/2016 | Kimishima | ............ | G01C 17/28 33/356 |
| 2016/0298969 A1 | 10/2016 | Glenn, III et al. | | |
| 2017/0003131 A1 | 1/2017 | Myeong | | |
| 2017/0089706 A1* | 3/2017 | Ribeiro | ................. | G01R 33/10 |
| 2017/0265041 A1* | 9/2017 | Mahasenan | ........... | H04W 64/00 |
| 2018/0024507 A1* | 1/2018 | Godlieb | ............... | A61C 17/221 700/62 |
| 2018/0109910 A1* | 4/2018 | Cerchio | ................ | H04W 4/027 |

FOREIGN PATENT DOCUMENTS

| | | | | |
|---|---|---|---|---|
| CN | 105698785 A | 6/2016 | | |
| KR | 20130083176 A | * | 7/2013 | |
| WO | WO-2015025614 A1 | * | 2/2015 | ............. G01C 17/38 |

* cited by examiner

| Abbreviation | Name |
|---|---|
| x | x component |
| y | y component |
| z | z component |
| m | magnitude |
| i | inclination |
| a | azimuth |
| h | horizontal |
| v | vertical |

Equivalent representations:

$$hv \overset{eq.}{\Leftrightarrow} mi$$

$$xyz \overset{eq.}{\Leftrightarrow} mia$$

POSITION DETERMINATION DEVICE AND METHOD

BACKGROUND

Field of the Disclosure

The present disclosure relates to a position determination device and a corresponding position determination method for determining the position of the device, in particular indoors. The present disclosure relates further to a mobile device and a non-transitory computer-readable recording medium.

Description of Related Art

For indoor positioning (in particular localization and/or navigation) many technologies are being researched. The geomagnetic fingerprinting technology takes advantage of the fact that the magnetic field inside buildings is distorted by the building's construction (material) in a unique way. The idea is to collect magnetic maps of the building (offline phase), which can be used later for navigation (online phase), in a way that current magnetic measurements are matched against the mapped magnetic profile (magnetic fingerprints). The more components a fingerprint contains, the more unique is its evaluation; on the other hand, the less components a fingerprint has, the more matches will be found in a fingerprint map. Of course, a magnetic map of a building may contain many duplicates or at least similar entries.

The Earth's magnetic field can be represented by a 3-dimensional vector (i.e. has x, y, z components), which principally allows generating 3-dimensional fingerprints. However, as the measurements depend on the sensor orientation of the magnetic sensor, which often cannot, or only partly, be detected (e.g. by means of an acceleration sensor), only one magnetic component (e.g. magnitude) or two components (e.g. vertical and horizontal component) may be usable in practice as fingerprint.

The "background" description provided herein is for the purpose of generally presenting the context of the disclosure. Work of the presently named inventor(s), to the extent it is described in this background section, as well as aspects of the description which may not otherwise qualify as prior art at the time of filing, are neither expressly or impliedly admitted as prior art against the present disclosure.

SUMMARY

It is an object to provide a position determination device that enables accurate position determination even in case of dynamic magnetic field conditions. It is a further object to provide a corresponding method, a mobile device as well as a corresponding computer program for implementing said method and a non-transitory computer-readable recording medium for implementing said method.

According to an aspect there is provided a position determination device comprising:
  data input circuitry configured to obtain magnetic field sensor data sensed by a magnetic field sensor,
  detection circuitry configured to detect temporal variations of the magnetic field and to generate temporal variation information indicating the detected temporal variation of the magnetic field, and
  magnetic fingerprinting circuitry configured to determine a first position estimate of the sensor position by comparing the obtained magnetic field sensor data with a magnetic map comprising magnetic fingerprints of a region around the magnetic field sensor and using the generated temporal variation information.

According to a further aspect there is provided a mobile device comprising:
  a magnetic field sensor for sensing magnetic field sensor data at the position of the mobile device,
  measurement circuitry for acquiring measurement data allowing position estimation of the magnetic field sensor, and
  a position determination device as disclosed herein for determining the position of the mobile device based on the sensed magnetic field sensor data and the acquired measurement data.

According to still further aspects a corresponding position determination method, a computer program comprising program means for causing a computer to carry out the steps of the method disclosed herein, when said computer program is carried out on a computer, as well as a non-transitory computer-readable recording medium that stores therein a computer program product, which, when executed by a processor, causes the method disclosed herein to be performed are provided.

Embodiments are defined in the dependent claims. It shall be understood that the disclosed method, the disclosed mobile device, the disclosed computer program and the disclosed computer-readable recording medium have similar and/or identical further embodiments as the claimed position determination device and as defined in the dependent claims and/or disclosed herein.

One of the aspects of the disclosure is to detect a dynamic magnetic field or distinguish a dynamic magnetic field from the normal movement of the magnetic field sensor (or user carrying said sensor) through a static magnetic field, respectively. Furthermore, improvements of the position determination based on this detection result are described.

In embodiments means to detect and mitigate large position errors in buildings (e.g. in train stations, airports, shopping malls, etc.) caused by temporal variations of the magnetic field, which may e.g. be caused by currents flowing in the current lines (e.g. overhead line of metro lines) or by moving ferrous objects such as elevators. The information contained in the temporal variations of the measured magnetic field may further be exploited.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWING

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Typically, for geomagnetic fingerprinting, the magnetic field is assumed to be static (i.e. non-time-varying). If the magnetic field is time-varying (dynamic), the localization accuracy will be degraded or localization estimation may not be feasible at all in time-varying magnetic field conditions without additional considerations. Time-varying magnetic field conditions might occur at different locations, e.g. near elevators where the large moving metal parts of the elevator lead to dynamic magnetic field conditions. Other examples are locations near overhead lines of trains: The time-varying current of the overhead lines leads to time-varying magnetic fields.

The present disclosure provides solutions to cope with dynamic magnetic field conditions. In particular, means are disclosed to detect a dynamic (i.e. time-varying) magnetic field and/or distinguish a dynamic magnetic field from the normal movement of the user through a static magnetic field. Furthermore, improvements of the localization system based on this detection result are disclosed.

Figure 1:
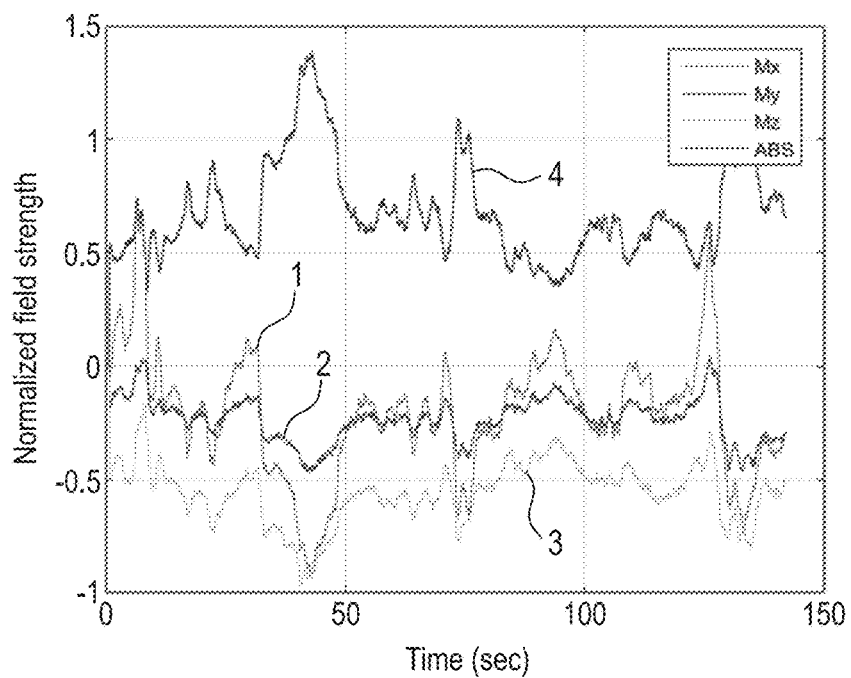
FIG. 1 shows a diagram illustrating exemplary magnetic field sensor data of a magnetic field sensor at a fixed location.

Referring now to the drawings, wherein like reference numerals designate identical or corresponding parts throughout the several views, FIG. 1 shows a diagram illustrating exemplary magnetic field sensor data of a magnetic field sensor at a fixed location, in this example a train station. The time-dependent magnetic sensor signal (as e.g. shown in FIG. 1) may be caused by a time-varying magnetic field. In FIG. 1, three orthogonal components of the magnetic field (Mx component 1, My component 2, Mz component 3) and the absolute value 4 of the sum of the three components 1-3 are shown.

Figure 2:
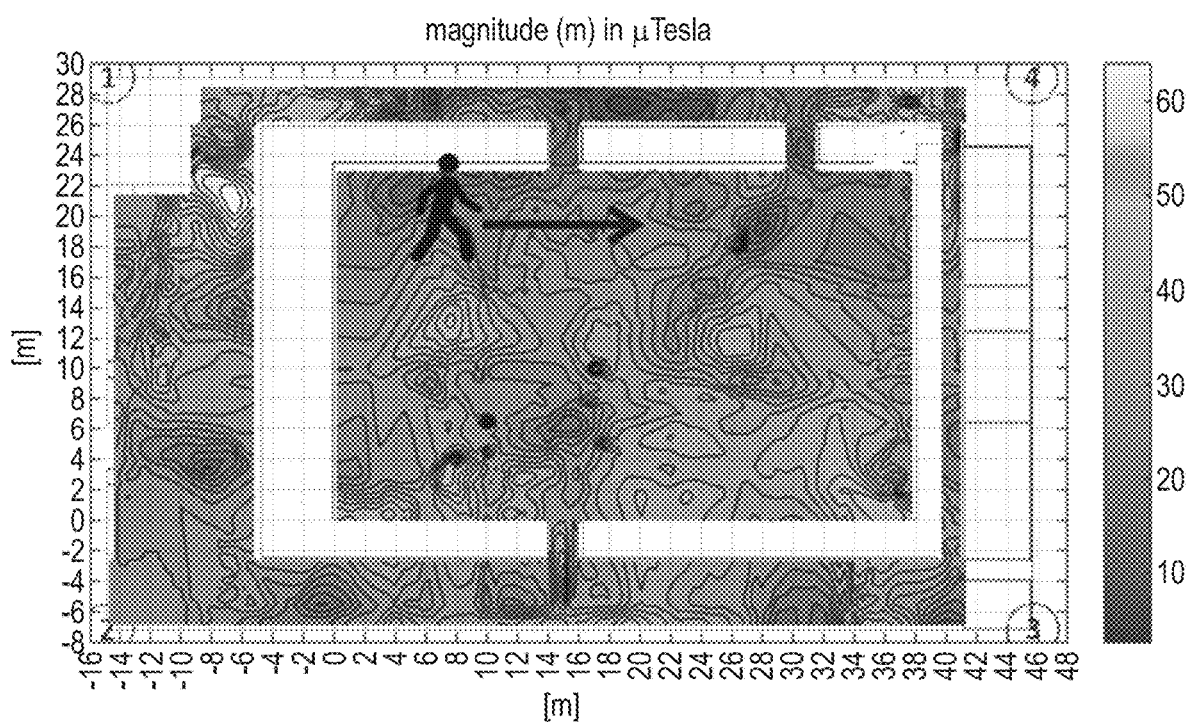
FIG. 2 shows a diagram of an example of the magnitude of the geomagnetic field in a building.

It is also possible that the time-dependent magnetic sensor signal is caused by the movement of a person carrying the magnetic field sensor through a static magnetic field, which is the typical assumption for geomagnetic fingerprinting. This is illustrated in FIG. 2 showing an example of the magnitude of the geomagnetic field in a building.

Before details of the present disclosure will be described, some definitions shall be given. The term "magnetic map" refers to either the magnetic map (comprising magnetic fingerprints) of a whole area, preferably indoors such as a building, or a sub-part of the magnetic map of the whole area, e.g. a sub-part of the building, such as a floor or a wing of the building. A magnetic map for use in the embodiments disclosed herein, or a suitable sub-part of the magnetic map, respectively, comprises magnetic fingerprints of a region around the magnetic field sensor. It can be selected based on a current position of the magnetic field sensor, for example a given location estimate and, optionally, its assumed confidence (e.g. estimated position accuracy), or by a user downloading a suitable magnetic map from a server, etc.

Figure 3:
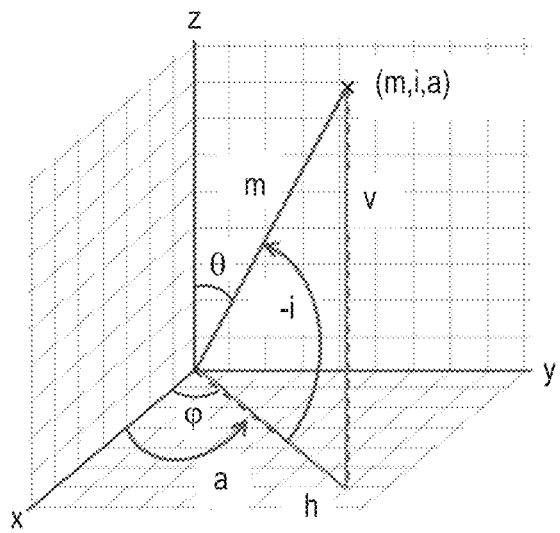
FIG. 3 shows a diagram illustrating coordinate definitions of a magnetic field vector.

The term "magnetic field metrics" refers to magnetic field measuring data (for example, magnetic flow densities in x, y, and z direction of the sensor's local coordinate system for a 3D sensor) or any mathematical combinations or operations thereof, which can be used as the components of the magnetic field vector. An illustration of different representations of the magnetic field vector is shown in FIG. 3 illustrating coordinate definitions of a magnetic field vector. Example metrics are magnetic field magnitude m, magnetic field inclination i, magnetic field azimuth a, magnetic field vertical component v, magnetic field horizontal component h, magnetic field Cartesian components (x, y, z) and their combinations. For example, the magnetic field vector may be represented by the metrics magnetic field horizontal component h and magnetic field vertical component v. Alternatively, a representation by the metrics magnetic field magnitude m and magnetic field inclination I can be used. For some situations, a further alternative representation by the magnetic field magnitude m, the magnetic field inclination i and the magnetic field azimuth a may be chosen, or a representation by the Cartesian components x, y and z.

Figure 4:
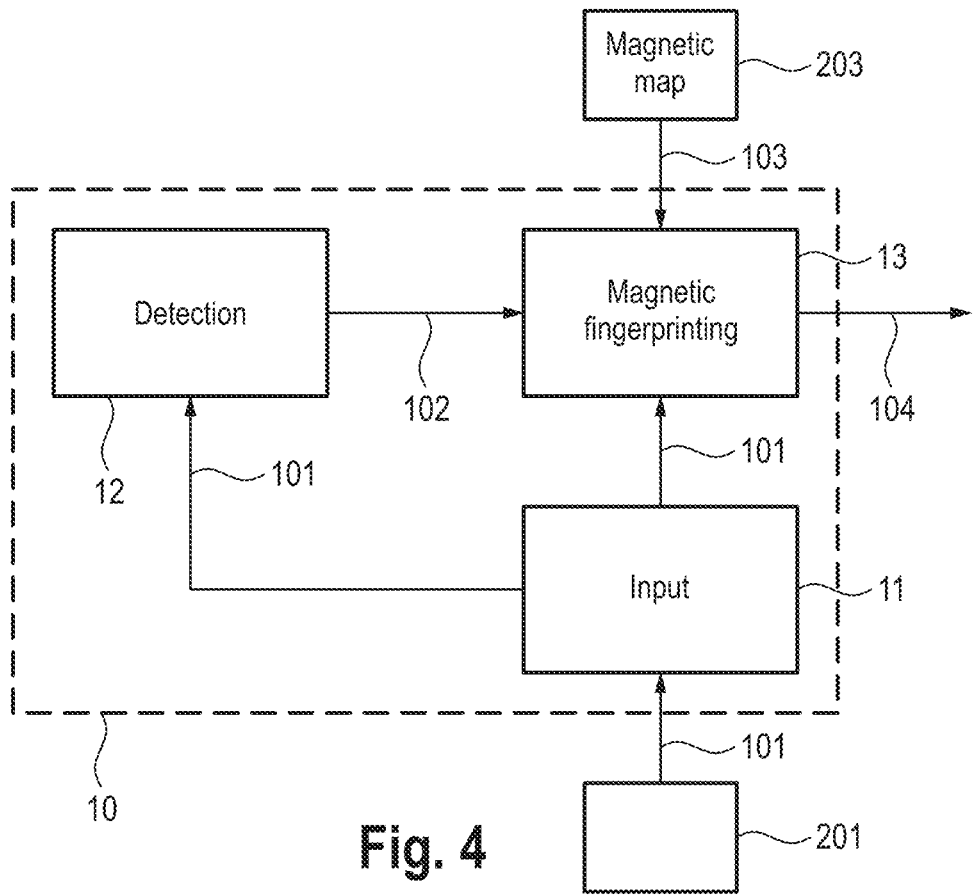
FIG. 4 shows a schematic diagram of a first embodiment of a position determination device according to the present disclosure.

FIG. 4 shows a schematic diagram of a first embodiment of a position determination device 10 according to the present disclosure. The position determination device 10 comprises a data input circuitry 11 configured to obtain magnetic field sensor data 101 sensed by a magnetic field sensor 201 (in this embodiment not being part of the device 10). The data input circuitry 11 may be represented by a data interface, e.g. an interface (such as a HDMI, USB, network interface, etc.) for data reception or retrieval, to receive or retrieve the magnetic field sensor data 101 directly from the magnetic field sensor 201 or from an storage means (e.g. a data carrier, an electronic memory, a buffer, etc.; not shown) where the magnetic field sensor data 101 are stored or buffered.

The position determination device 10 further comprises a detection circuitry 12 configured to detect temporal variations of the magnetic field and to generate temporal variation information 102 indicating the detected temporal variation of the magnetic field. For example, the temporal variation information 102 may indicate that a temporally varying magnetic field is detected and/or describe the detected temporal variation of the magnetic field. The detection circuitry may be implemented in different ways and may use different kinds of data to detect if the magnetic field is varying rather than static. Preferably, the temporal variation information 102 indicates not only that the magnetic field is temporally varying, but also in which way and/or to which extent and/or in which area the magnetic field is varying. For example, the temporal variation information 102 may contain a flag or similar to indicate that a temporal variation of the magnetic field has been detected. Additionally or alternatively, the detection circuitry 12 may separate the static portions of the measured magnetic field data from the temporally varying portions of the measured magnetic field data and generate the temporal variation information 102 such that it contains a description or representation of one or more properties of the temporal variation (or temporally varying portions, respectively) such as at least one of coherence time, peak values, and location of appearance. Embodiments for implementing the detection circuitry 12 will be explained below.

As input data, the detection circuitry 12 receives the magnetic field sensor data 101.

A temporal variation of the magnetic field may be detected by considering the coherence time of the measured magnetic field, i. e. how fast it changes over time. The coherence time may be determined based on a series of sequential (and preferably equidistant) measurement values of the magnetic field sensor data 101. The shorter the coherence time, the faster is the temporal variation of the magnetic field, and the less reliable the information contained in the magnetic field sensor data 101. In this embodiment, the temporal variation information 102 may e.g. comprise the coherence time or a normalized version of the coherence time (in this latter case, the detection circuitry 12 preferably knows or receives reference values for the normalization), or just an indication that a temporal variation of the magnetic field has been detected in case the coherence time is shorter than a predefined threshold value.

In some embodiments, the detection circuitry 12 may receive further input data. For example, the detection circuitry 12 may receive one or more predefined local threshold values which may be valid, e. g., for certain areas (town, street, building, floor, per square meter, . . . ). The local threshold values may be stored as part of the magnetic map 203, in a device storage, obtained from a server or similar. A temporal variation of the magnetic field may be detected if the measured magnetic field value exceeds or falls below, respectively, the suitable local threshold value (which may be selected e. g. based on a previous or expected position estimate).

The position determination device 10 further comprises a magnetic fingerprinting circuitry 13 configured to determine a first position estimate 104 of the sensor position by comparing the obtained magnetic field sensor data 101 with a magnetic map 103 comprising magnetic fingerprints of a region around the magnetic field sensor 20 and using the generated temporal variation information 102 (i.e. taking the generated temporal variation information 102 into account or, directly or indirectly, applying it in the determination of the first position estimate or the finally determined sensor position, as done in other embodiments that are explained below). The magnetic map 103 is generally acquired in advance and e.g. provided by a service provider, the owner or operator of a building in which the position determination shall be used, etc., and may be stored in a storage means (not shown; in this embodiment not being part of the device 10) or provided by a server 203 (generally not being part of the device 10), e.g. via the internet or another network. For example, a user may download a magnetic map of a location he wants to visit, or a suitable magnetic map may be downloaded or provided automatically based on current position information of (a device comprising or connected to) the magnetic field sensor 201 (like GPS information obtained before entering a building, or upon detection of a Bluetooth beacon placed at an entry of a building etc.)

The detection circuitry 12 and the magnetic fingerprinting circuitry 13 may be implemented in (common or separate) hard- and/or software, e.g. an appropriately programmed processor or computer.

In an embodiment the magnetic fingerprinting circuitry 13 uses the temporal variation information to determine the first position estimate by subtracting dynamic portions of the magnetic field, as particularly represented by or included in the temporal variation information 102, from the obtained magnetic field sensor data 101 before comparing it with the magnetic map 103. In another embodiment, the magnetic fingerprinting circuitry uses the temporal variation information by analyzing dynamic portions of the magnetic field indicated by the temporal variation information to obtain additional position information. For example, based on a signal strength of a dynamic contribution at f=16.7 Hz, a distance from a city train track may be estimated, etc. This additional position information may be used in addition to the first position estimate 104 to determine the sensor position. In this way the precision of the sensor position determination can be improved.

Figure 5:
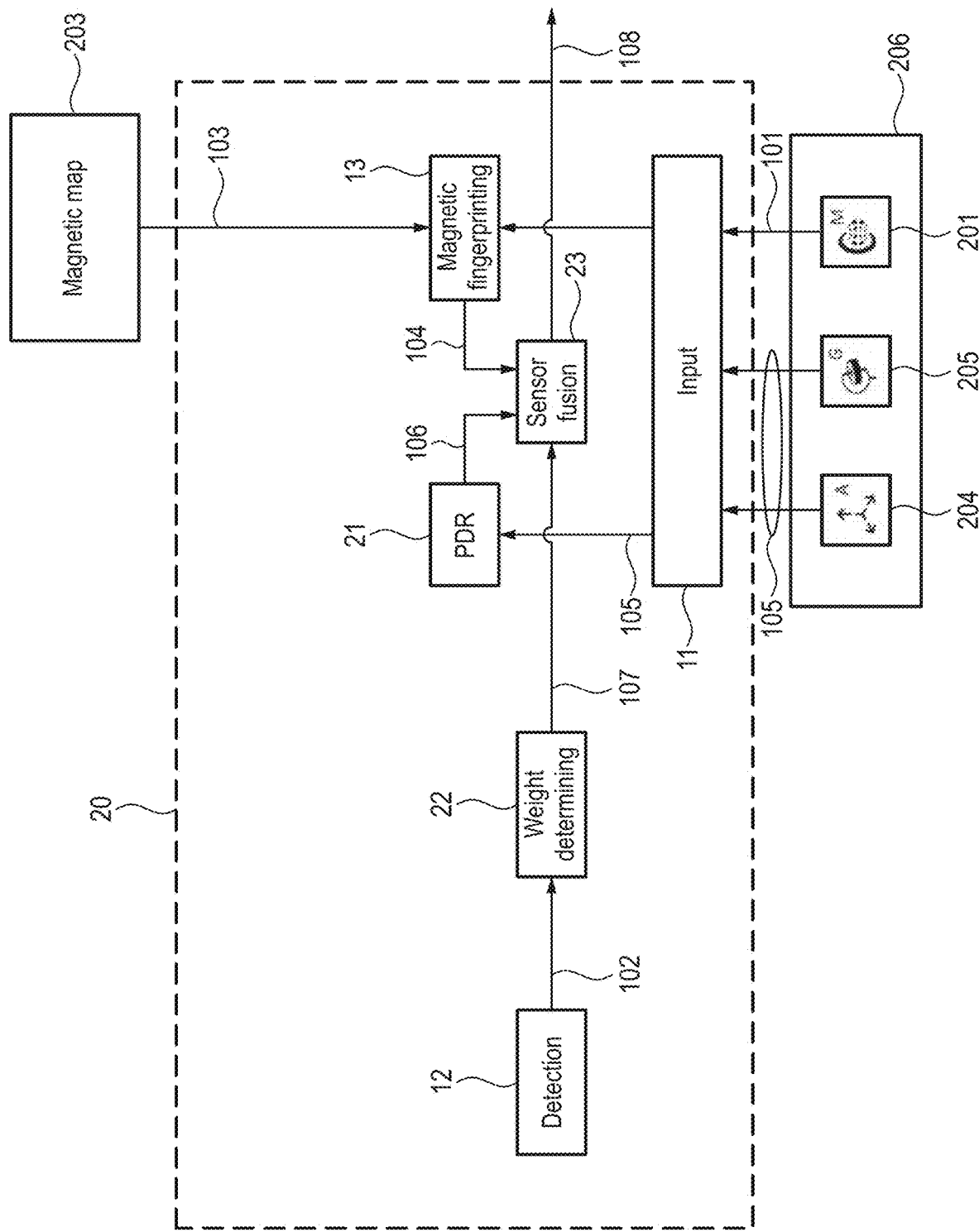
FIG. 5 shows a schematic diagram of a second embodiment of a position determination device according to the present disclosure.

FIG. 5 shows a schematic diagram of a second embodiment of a position determination device 20 according to the present disclosure. In this embodiment the data input circuitry 11 obtains measurement data 105 in addition to the magnetic sensor data 101, the measurement data 105 allowing position estimation of the magnetic field sensor 201 or of a device commonly comprising the magnetic field sensor 201 and one or more sensor capturing the measurement data 105, respectively. Said measurement data 105 may e.g. include motion data indicating motion of the magnetic field sensor 201 and/or electromagnetic field data indicating the electromagnetic field. Motion data may e.g. be obtained from an accelerometer 204 and/or a gyroscope 205, and electromagnetic field data may e.g. be obtained from an antenna (not shown). The magnetic field sensor 201, the accelerometer 204 and the gyroscope 205 are preferably arranged in a common device, e.g. in a sensor device 206 or a mobile user device such as a smartphone, tablet or wearable, like a smart watch.

The position determination device 20 of this embodiment further comprises a position estimation circuitry 21 configured to determine a second position estimate 106 of the sensor position from the obtained measurement data 105. For instance, from the motion data the distance and direction of movement of the magnetic field sensor 201 (from the last known position) may be estimated, e.g. using pedestrian dead reckoning (PDR). The electromagnetic field data may be used for comparison with electromagnetic fingerprints to estimate the sensor position.

The position determination device 20 further comprises a weight determination circuitry 22 configured to adapt weight information 107 in dependence on the reliability of the measured magnetic field data, namely to determine the weight information 107 based on said temporal variation information 102 (and/or based on the confidence value provided in the magnetic map or the confidence value for another position estimate). The determined weight information 107 indicates the relative or absolute weight of the first position estimate 104 and the second position estimate 106 in the determination of the sensor position 108. For instance, the first weight may be decreased if the temporal variation information 102 indicates the existence of temporal variations of the magnetic field, or if the temporal variations are above a threshold. Further, the extent by which the first weight is decreased may be larger the stronger the temporal variations are. Hence, if the magnetic field is time-variable the second position estimate 106, which is not based on the magnetic fingerprinting, gets more weight (up to the point where it is used alone for sensor position determination), and if the magnetic field is stable (time-invariable) the first position estimate 104 gets more weight (up to the point where it is used alone for sensor position determination).

The coherence time, which may be used in an embodiment of the detection circuitry for determining the temporal variation, may further be used as first weight, and the temporal variation information could then also be used directly for weighting. Further, in case of the use of particle filters, the confidence interval (i.e. the upper/lower limit) could be dependent on the location or orientation of the particle. The adaption of the weights can be made in a discrete manner by use of several thresholds or in a continuous manner based e.g. on an algorithm.

The position determination device 20 further comprises a position determination circuitry 23 (also called sensor fusion unit) configured to weight the first and second position estimates 104, 106 of the sensor position according to the determined weight information 107 and to determine the sensor position 108 from the weighted first and second position estimates 104, 106, leading to a further improvement and higher reliability of the determined sensor position, no matter if the magnetic field is stable or variable.

Figure 6:
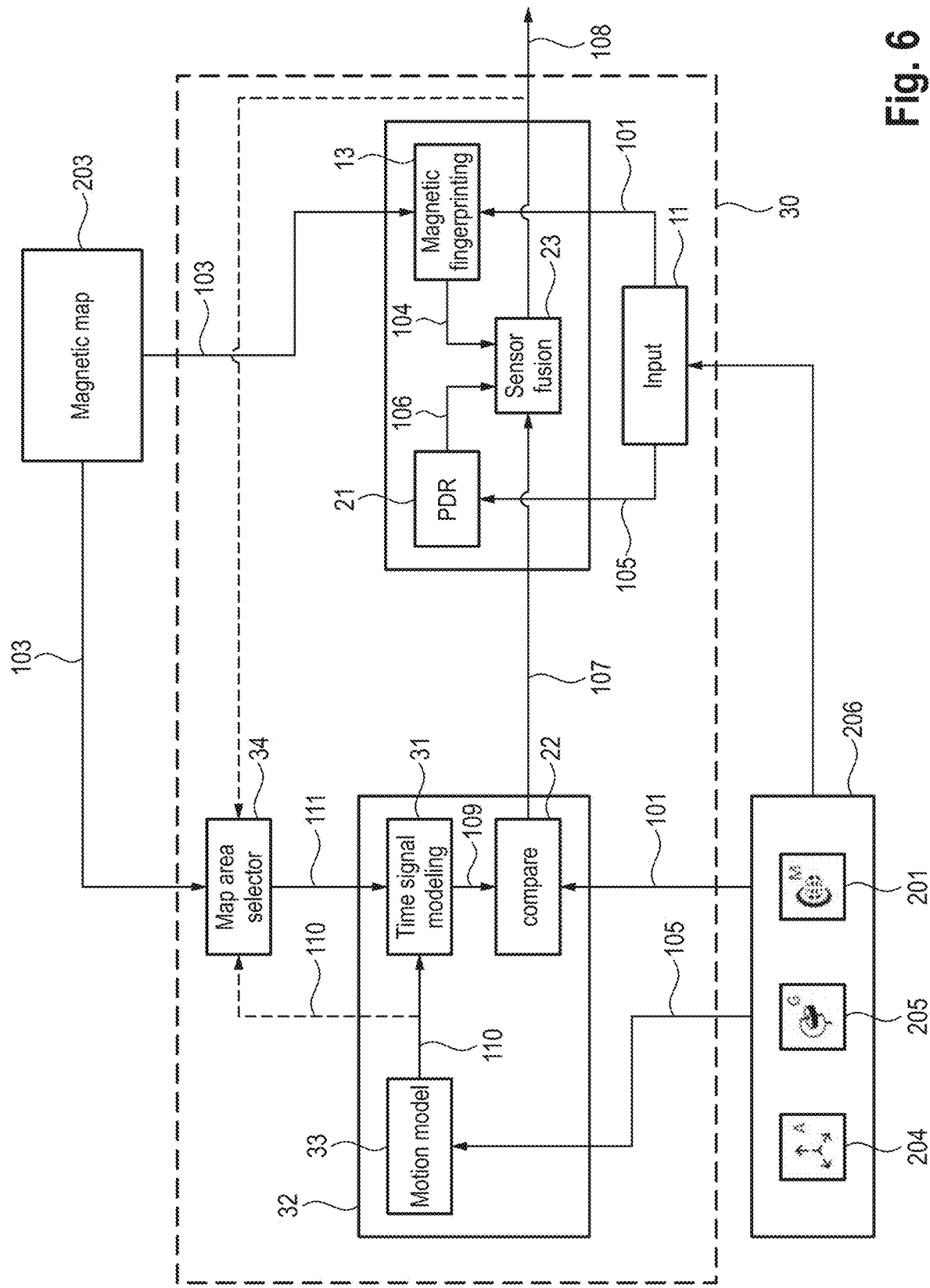
FIG. 6 shows a schematic diagram of a third embodiment of a position determination device according to the present disclosure.

FIG. 6 shows a schematic diagram of a third embodiment of a position determination device 30 according to the present disclosure, which detects temporal variations of the magnetic field using the magnetic map (and, optionally, motion data received from other sensors). This allows a particularly reliable distinction between temporal variations (dynamic portions) of the magnetic field and variations, which are caused by movement of the magnetic field sensor through a static magnetic field.

This embodiment comprises an embodiment of a detection circuitry 32 (also called "dynamic magnetic field detector"). One of the ideas of this embodiment is to compare the magnetic field sensor signal 101 of the magnetic field sensor 201 with an expected time-varying signal 109 (optionally, a metric of the estimated time-varying signal 109 and the magnetic field sensor signal 101 may be used, like coherence time or temporal variance) in the weight determination circuitry 22 (also called "comparison unit"). The expected time-varying signal 109 is modeled using a time signal modelling circuitry 31 (also called "time signal modelling unit") based on the estimated user's motion 110 (e.g., including a speed and/or motion trajectory) estimated in a motion modelling circuitry 33 (also called "motion model") and the magnetic map input 111.

The output of the detection circuitry 32, in particular the weight information 107, is used to improve the sensor fusion algorithm in the position determination circuitry 23. Different embodiments of the position determination device 30 and its components are discussed below.

In one embodiment a maximal (or minimal) expected magnetic field metric is determined as the time-varying signal 109 based on the magnetic map 103 e.g. of the building (e.g. through comparison against the absolute reference value). A temporal variation of the magnetic field is detected if the measured magnetic field metric 101 exceeds (or goes below) the maximal (or minimal) expected magnetic field metric 109.

A map area selection circuitry 34 (also called "map area selector") may be provided that selects an area from the magnetic map 103 based on the (previously determined) sensor position 108, particularly an area in the vicinity of the last sensor position 108. In some embodiments, the selection may be based on at least two previous sensor positions 108. In one embodiment, the area or its size, respectively, might be determined based on at least one of the user's estimated motion 110, motion and/or direction information directly obtained from measurement data 105, one or more previous sensor positions 108, and a map of the location (e. g., a floor plan of a building etc.). For example, the area may be selected to comprise positions, which a user carrying the magnetic field sensor 201 may reach with a probability higher than a threshold probability within a certain time period. The output 111 of the map area selection circuitry 34 may include the maximum/minimum values of the magnetic map in the relevant area. The metrics of the minimum/maximum values can correspond to different representations (as shown in FIG. 3) of the magnetic field vector (or any combinations thereof) after alignment of measurement and the map coordinate system.

If the magnetic field inclination i is exemplarily used as a metric, a temporal variation of the magnetic field may e.g. be detected if the range of the inclination angles in the magnetic map area is between 20° and 40°, whereas the measured inclination angle is 60° with a detection threshold of T=50°. The detection threshold may e.g. predetermined as a percentage with respect to the expected range (e.g. the upper, or lower, or middle value of the range). Thus, in an embodiment the detection circuitry 32 is configured to determine the temporal variation information by comparing the obtained magnetic field sensor data 101 with expected magnetic field data 109, which may be determined from the obtained motion data 110 and the selected area 111 of the magnetic map 103. The motion data 110 may further be used to select the area 111.

In another embodiment the maximal expected temporal variation of the magnetic field metric is estimated based on the speed 110 of sensor device 201 (i.e. the output of motion modelling circuitry 33, which may provide the estimated speed and a predefined upper limit of a maximum assumed user's speed if the sensor is carried by a user) and/or the spatial variations of the magnetic field metric obtained from the magnetic map of the building. Hence, in other words, in this embodiment a spatial variation of the magnetic map is converted into a temporal variation (motion model), which is then compared with the measured temporal variation.

A dynamic magnetic field is detected if a measured temporal variation of the magnetic field metric is larger than a maximal expected temporal variation of the magnetic field metric due to spatial variation of the magnetic field metric(s) in the magnetic map and the current speed of the sensor device. The measured temporal variation of the magnetic field metric is hereby based on two or more subsequent measurement values of the obtained magnetic field sensor data 101 and thus represents is change over time/location. The metric(s) can be different depending on the representation of the magnetic field vector (or any combinations thereof) after rotation compensation.

In another embodiment statistics (e.g. mean, variance, higher order statistics, probability density function, etc.) of the magnetic field metric of preceding measurements of the sensor device and spatial variations of the magnetic map of the building may be computed. A temporally varying magnetic field is detected if the estimated statistics of the measurements (e.g. a sequence of subsequent measurements) deviate from the magnetic map statistics to a certain extent, e.g. more than a predetermined limit.

Further, in an embodiment at least two (temporally subsequent) measurements approximately at the same location of the building may be made. A temporal magnetic field is detected if the measured magnetic field values largely deviate from each other. This may be used as an additional indicator in the disclosed method and device that the magnetic field is time-variable.

Still further, the current localization estimate may be used to derive information about the expected time-variation, local spatial variation, and/or reliability of the magnetic fingerprint information from the magnetic map.

In another embodiment the magnetic map may contain information about the time-variation for selected locations or for each location. This information may be a reliability factor for each magnetic fingerprint stored in the map (where high time-variations relate to a low reliability factor and vice versa). Further, this information may also be a local spatial variation of the magnetic fingerprint in the vicinity of the localization estimate (e.g. magnetic magnitude expected to be almost constant and thus reliable even in case of smaller localization errors, but still a huge change of the magnetic field magnitude is observed; it is concluded then that the user cannot have moved to a distant location where a huge change of the magnetic field magnitude can appear). Still further, two (or more) different magnetic maps can be recorded (and compared against each other) in areas where the magnetic field variations can be approximated by a few states for most of the time. For example, two magnetic maps can be recorded in the vicinity of an elevator or other electronic devices that are known to cause variations of the magnetic field. For the example of an elevator, one map may describe the magnetic field when the elevator is on the same floor and the other map may describe the magnetic field when the elevator is on a different floor. Alternatively, a magnetic map may comprise two or more distinct magnetic fingerprints for one position, indicating different states the magnetic field may take at this position at different times. Thus, while there would be only one fingerprint entry for some positions, the map might contain two or more fingerprint entries for other positions.

To improve position determination in case of a detection of a temporal variation of the magnetic field, various actions may be taken. For instance, as explained above, the weighting of the magnetic fingerprint information 104 in the sensor fusion process of the indoor positioning solution may be adapted (in particular reduced) with respect to other information used at the same time for indoor positioning. The other information used for indoor positioning might e.g. be pedestrian dead reckoning (e.g. step detection, step length estimation, heading estimation), or Bluetooth beacons, Wifi fingerprinting, etc., commonly referred to as measurement information used for computing a second position estimate 106.

In another embodiment, temporal magnetic field variations caused e.g. by overhead lines in a train station, may be predicted or recognized and subtracted. This might be possible if e.g. the temporal variations occur periodically or from time to time and/or possess a very distinct progression.

Still further, in an embodiment the temporal variations may be exploited for location estimation. It is e.g. known that certain temporal variations occur in the vicinity of overhead lines. Hence, such information can be used for (coarse) localization in a train station. The maximal and minimal field values (e.g. magnitude) may provide information about the (relative) distance and the curve progression (e.g. periodicity of 16.7 Hz) about the type of train. A time-variant magnetic field may also indicate the existence of large moving ferrous objects in the vicinity, such as an elevator, escalator, robot, etc. Typically, the position, or a number of possible positions, of such objects in the building is known, and as a consequence position information can be (indirectly) derived from the temporal variation of the magnetic field.

Figure 7:
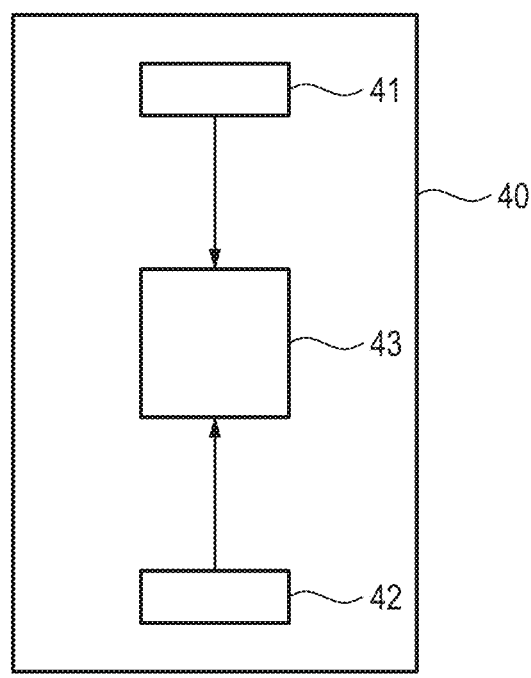
FIG. 7 shows a schematic diagram of an embodiment of a mobile device according to the present disclosure.

FIG. 7 shows a schematic diagram of an embodiment of a mobile device 40 according to the present disclosure. The mobile device 40 may e.g. be a handheld device, a wearable device, a mobile phone, a smartphone, a portable phone, a camera, a watch, a vital signs monitor, a laptop, a tablet, glasses, or any other portable device that may be carried around by a user. The mobile device 40 comprises a magnetic field sensor 41 (e.g. a magnetic field sensor 201 as shown in FIGS. 4-6) for sensing magnetic field sensor data at the position of the mobile device, measurement circuitry 42 for acquiring measurement data allowing position estimation of the magnetic field sensor and mobile device, respectively, and a position determination device 43 (e.g. a position determination device 10, 20, 30 as shown in FIGS. 4-6) as disclosed herein for determining the position of the magnetic field sensor and mobile device 40, respectively, based on the sensed magnetic field sensor data and the acquired measurement data. The measurement circuitry 42 may comprise a motion detector for acquiring motion information indicating motion of the mobile device and/or an electromagnetic field detector for acquiring electromagnetic field data indicating the electromagnetic field.

Figure 8:
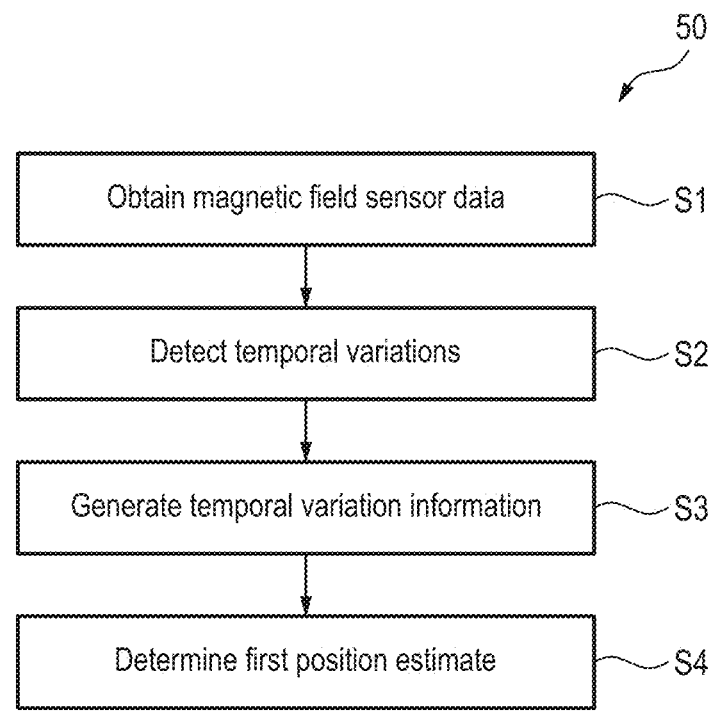
FIG. 8 shows a flowchart of an embodiment of a method according to the present disclosure.

FIG. 8 shows a flowchart of an embodiment of a method 50 according to the present disclosure. In a first step S1 of the method 50 magnetic field sensor data sensed by a magnetic field sensor are obtained. In a second step S2 temporal variations of the magnetic field are detected. In a third step S3 temporal variation information indicating the detected temporal variation of the magnetic field are generated. In a fourth step S4 a first position estimate of the sensor position is determined by comparing the obtained magnetic field sensor data with a magnetic map comprising magnetic fingerprints of a region around the magnetic field sensor and using the generated temporal variation information.

In summary, today's indoor positioning solutions typically consider magnetic field sensor data, e.g. by relying on compass information or applying geomagnetic fingerprinting. The present disclosure provides means to detect and mitigate large position errors in buildings caused by temporal variations of the magnetic field. In addition, this disclosure proposes to exploit the information contained in the temporal variations of the measured magnetic field.

Thus, the foregoing discussion discloses and describes merely exemplary embodiments of the present disclosure. As will be understood by those skilled in the art, the present disclosure may be embodied in other specific forms without departing from the spirit or essential characteristics thereof. Accordingly, the disclosure of the present disclosure is intended to be illustrative, but not limiting of the scope of the disclosure, as well as other claims. The disclosure, including any readily discernible variants of the teachings herein, defines, in part, the scope of the foregoing claim terminology such that no inventive subject matter is dedicated to the public.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

In so far as embodiments of the disclosure have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present disclosure. Further, such a software may also be distributed in other forms, such as via the Internet or other wired or wireless telecommunication systems.

The elements of the disclosed devices, apparatus and systems may be implemented by corresponding hardware and/or software elements, for instance appropriated circuits. A circuit is a structural assemblage of electronic components including conventional circuit elements, integrated circuits including application specific integrated circuits, standard integrated circuits, application specific standard products, and field programmable gate arrays. Further a circuit includes central processing units, graphics processing units, and microprocessors which are programmed or configured according to software code. A circuit does not include pure software, although a circuit includes the above-described hardware executing software.

It follows a list of further embodiments of the disclosed subject matter:

1. A position determination device comprising:
   data input circuitry configured to obtain magnetic field sensor data sensed by a magnetic field sensor,
   detection circuitry configured to detect temporal variations of the magnetic field and to generate temporal variation information indicating the detected temporal variation of the magnetic field, and
   magnetic fingerprinting circuitry configured to determine a first position estimate of the sensor position by comparing the obtained magnetic field sensor data with a magnetic map comprising magnetic fingerprints of a region around the magnetic field sensor and using the generated temporal variation information.

2. The position determination device as defined in any preceding embodiment, wherein said magnetic fingerprinting circuitry is configured to determine the first position estimate by subtracting dynamic portions of the magnetic field from the obtained magnetic field sensor data before comparing with it with the magnetic map and/or to analyze the dynamic portions to obtain additional position information used in addition to the first position estimate to determine the sensor position.

3. The position determination device as defined in any preceding embodiment,
   wherein said data input circuitry is configured to obtain measurement data allowing position estimation of the magnetic field sensor, and
   wherein said position determination device further comprises
      position estimation circuitry configured to determine a second position estimate of the sensor position from the obtained measurement data,
      weight determination circuitry configured to determine weight information based on said temporal variation information, the determined weight information indicating the relative or absolute weight of the first position estimate and the second position estimate in the determination of the sensor position, and
      position determination circuitry configured to weight the first and second position estimates of the sensor position according to the determined weight information and to determine the sensor position from the weighted first and second position estimates.

4. The position determination device as defined in any preceding embodiment,
   wherein said data input circuitry is configured to obtain motion data indicating motion of the magnetic field sensor and
   wherein said detection circuitry is configured to determine the temporal variation information from the obtained magnetic field sensor data and the obtained motion data and/or by comparing the obtained magnetic field sensor data with expected magnetic field data determined from the obtained motion data and the magnetic map.

5. The position determination device as defined in embodiment 4,
   wherein further comprising a map area selection circuitry configured to select an area from the magnetic map based on the determined sensor position,
   wherein said detection circuitry is configured to determine the temporal variation information by comparing the obtained magnetic field sensor data with expected magnetic field data determined from the obtained motion data and the selected area of the magnetic map.

6. The position determination device as defined in embodiment 4,
   wherein said detection circuitry is configured to determine the temporal variation information indicating that the magnetic field temporally varies if a measured temporal variation of a magnetic field metric of the obtained magnetic field sensor data is larger than a maximal expected temporal variation of the magnetic field metric due to spatial variation of the magnetic field metric in the magnetic map and the current speed of the sensor device determined from the obtained motion data.

7. The position determination device as defined in any preceding embodiment, further comprising a map area selection circuitry configured to estimate maximum and/or minimum values of a magnetic field metric from the magnetic map,
   wherein said detection circuitry is configured to determine the temporal variation information by determining if one or more components of the magnetic field data exceed and/or are below the estimated maximum and/or minimum values of a corresponding component of the magnetic field metric.

8. The position determination device as defined in any preceding embodiment, wherein said detection circuitry is configured to determine statistics of a magnetic field metric of preceding sensor positions and corresponding spatial variations of the magnetic map and to determine the temporal variation information by determining if and/or to which extent a magnetic field metric of the obtained magnetic sensor data deviates from the determined statistics.

9. The position determination device as defined in embodiment 6, 7 or 8, wherein said magnetic field metric is one or more of the magnetic field magnitude, the azimuth and the inclination.

10. The position determination device as defined in embodiment 3,
    wherein the magnetic map includes reliability information and/or spatial variation information indicating the reliability and/or local spatial variations of magnetic fingerprints of the magnetic map and
    wherein said weight determination circuitry is configured to additionally use said reliability information and/or spatial variation information in the determination of the weight information.

11. The position determination device as defined in any preceding embodiment, wherein said magnetic fingerprinting circuitry is configured to determine the first position estimate of the sensor position by comparing the obtained magnetic field sensor data with two or more magnetic maps of a region around the magnetic field sensor, said two or more magnetic maps representing the magnetic field for different states of existing objects.

12. The position determination device as defined in embodiment 3,
    wherein said data input circuitry is configured to obtain motion data indicating motion of the magnetic field sensor as measurement data and/or electromagnetic field data indicating the electromagnetic field as measurement data and
    wherein said position estimation circuitry is configured to determine the second position estimate of the sensor position from the obtained motion data by dead reckoning and/or from the obtained electromagnetic field data.

13. The position determination device as defined in any preceding embodiment, wherein said magnetic fingerprinting circuitry is configured to estimate temporal magnetic field variations caused by motion of an existing object and to subtracting the estimated temporal magnetic field variation from the obtained magnetic field sensor data before determining the first position estimate of the sensor position.

14. The position determination device as defined in embodiment 3,
wherein said position determination circuitry is configured to determine the sensor position by evaluating temporal magnetic field variations caused by AC currents and/or moving ferrous objects.

15. The position determination device as defined in embodiment 3,
wherein said weight determination circuitry is configured to decrease first weight if the temporal variation information indicates the existence of temporal variations of the magnetic field, or if the temporal variations are above a threshold, of the stronger the temporal variations are.

16. A position determination method comprising:
obtaining magnetic field sensor data sensed by a magnetic field sensor,
detecting temporal variations of the magnetic field,
generating temporal variation information indicating the detected temporal variation of the magnetic field, and
determining a first position estimate of the sensor position by comparing the obtained magnetic field sensor data with a magnetic map comprising magnetic fingerprints of a region around the magnetic field sensor and using the generated temporal variation information.

17. A mobile device comprising:
a magnetic field sensor for sensing magnetic field sensor data at the position of the mobile device,
measurement circuitry for acquiring measurement data allowing position estimation of the magnetic field sensor, and
a position determination device as defined in any preceding embodiment for determining the position of the mobile device based on the sensed magnetic field sensor data and the acquired measurement data.

18. The mobile device as defined in embodiment 17,
wherein said measurement circuitry comprises a motion detector for acquiring motion information indicating motion of the mobile device and/or an electromagnetic field detector for acquiring electromagnetic field data indicating the electromagnetic field.

19. The mobile device as defined in embodiment 17,
wherein said mobile device is one of a handheld device, wearable device, mobile phone, smartphone, portable phone, camera, watch, vital signs monitor, laptop, tablet, or glasses.

20. A non-transitory computer-readable recording medium that stores therein a computer program product, which, when executed by a processor, causes the method according to embodiment 16 to be performed.

21. A computer program comprising program code means for causing a computer to perform the steps of said method according to embodiment 16 when said computer program is carried out on a computer.

The invention claimed is:
1. A position determination device comprising:
data input circuitry configured to obtain magnetic field sensor data sensed by a magnetic field sensor,
detection circuitry configured to detect temporal variations of a magnetic field from the obtained magnetic field sensor data, and to generate temporal variation information indicating the detected temporal variations of the magnetic field, and
magnetic fingerprinting circuitry configured to determine a first position estimate of a position of the magnetic field sensor by comparing the obtained magnetic field sensor data with a magnetic map comprising magnetic fingerprints of a region around the magnetic field sensor and using the generated temporal variation information,
wherein said position determination device further comprises
position estimation circuitry configured to determine a second position estimate of the position of the magnetic field sensor from obtained measurement data,
weight determination circuitry configured to determine weight information based on said generated temporal variation information, the determined weight information indicating a relative or absolute weight of the first position estimate and a relative or absolute weight of the second position estimate for determination of the position of the magnetic field sensor, wherein said weight determination circuitry is configured to decrease the relative or absolute weight of the first position estimate when the temporal variation information indicates temporal variations of the magnetic field are above a threshold, and
position determination circuitry configured to weight the first position estimate and the second position estimate of the position of the magnetic field sensor according to the determined weight information, and to determine the position of the magnetic field sensor from the weighted first position estimate and the weighted second position estimate,
wherein said data input circuitry is configured to obtain motion data indicating motion of the magnetic field sensor, and
wherein said detection circuitry is configured to determine the temporal variation information from the obtained magnetic field sensor data and the obtained motion data by comparing the obtained magnetic field sensor data with expected magnetic field data determined from the obtained motion data and the magnetic map.

2. The position determination device as defined in claim 1,
wherein said magnetic fingerprinting circuitry is configured to determine the first position estimate by subtracting dynamic portions of the magnetic field from the obtained magnetic field sensor data before comparing it with the magnetic map and/or to analyze the dynamic portions to obtain additional position information used in addition to the first position estimate to determine the position of the magnetic field sensor.

3. The position determination device as claimed in claim 1,
further comprising a map area selection circuitry configured to select an area from the magnetic map based on a previously determined position of the magnetic field sensor,
wherein said detection circuitry is configured to determine the temporal variation information by comparing the obtained magnetic field sensor data with the expected magnetic field data determined from the obtained motion data and the selected area of the magnetic map.

4. The position determination device as claimed in claim 1,
wherein said detection circuitry is configured to determine the temporal variation information indicating that the magnetic field temporally varies if a measured temporal variation of a magnetic field metric of the obtained magnetic field sensor data is larger than a maximal expected temporal variation of the magnetic field metric due to spatial variation of the magnetic field metric in the magnetic map and a current speed of the magnetic field sensor determined from the obtained motion data.

5. The position determination device as claimed in claim 4,
wherein said magnetic field metric is one or more of a magnetic field, an azimuth and an inclination.

6. The position determination device as defined in claim 1,
further comprising a map area selection circuitry configured to estimate maximum and/or minimum values of a magnetic field metric from the magnetic map,
wherein said detection circuitry is configured to determine the temporal variation information by determining when one or more components of the magnetic field sensor data exceed and/or are below the estimated maximum and/or minimum values of a corresponding component of the magnetic field metric.

7. The position determination device as defined in claim 1,
wherein said detection circuitry is configured to determine statistics of a magnetic field metric of preceding positions of the magnetic field sensor and corresponding spatial variations of the magnetic map, and to determine the temporal variation information by determining if and/or to which extent a magnetic field metric of the obtained magnetic field sensor data deviates from the determined statistics.

8. The position determination device as defined in claim 1,
wherein the magnetic map includes reliability information and/or spatial variation information indicating reliability and/or local spatial variations of the magnetic fingerprints of the magnetic map, and
wherein said weight determination circuitry is configured to additionally use said reliability information and/or said spatial variation information in the determination of the weight information.

9. The position determination device as defined in claim 1,
wherein said magnetic fingerprinting circuitry is configured to determine the first position estimate by comparing the obtained magnetic field sensor data with two or more magnetic maps of the region around the magnetic field sensor, said two or more magnetic maps representing a magnetic field for different states of existing objects.

10. The position determination device as defined in claim 1,
wherein said data input circuitry is configured to obtain the motion data indicating the motion of the magnetic field sensor as the measurement data and/or electromagnetic field data indicating an electromagnetic field as the measurement data, and
wherein said position estimation circuitry is configured to determine the second position estimate from the obtained motion data by dead reckoning and/or from the obtained electromagnetic field data.

11. The position determination device as defined in claim 1,
wherein said magnetic fingerprinting circuitry is configured to estimate temporal magnetic field variations caused by motion of an existing object and to subtract the estimated temporal magnetic field variations from the obtained magnetic field sensor data before determining the first position estimate.

12. The position determination device as defined in claim 1,
wherein said position determination circuitry is configured to determine the position of the magnetic field sensor by evaluating temporal magnetic field variations caused by AC currents and/or moving ferrous objects.

13. A position determination method comprising:
obtaining magnetic field sensor data sensed by a magnetic field sensor,
detecting temporal variations of a magnetic field,
generating temporal variation information indicating the detected temporal variations of the magnetic field,
determining a first position estimate of a position of the magnetic field sensor by comparing the obtained magnetic field sensor data with a magnetic map comprising magnetic fingerprints of a region around the magnetic field sensor and using the generated temporal variation information,
determining a second position estimate of the position of the magnetic field sensor from obtained measurement data,
determining weight information based on said temporal variation information, the determined weight information indicating a relative or absolute weight of the first position estimate and a relative or absolute weight of the second position estimate for determination of the position of the magnetic field sensor, wherein determining the weight information includes decreasing the relative or absolute weight of the first position estimate when the temporal variation information indicates temporal variations of the magnetic field are above a threshold,
weighing the first position estimate and the second position estimate of the position of the magnetic field sensor according to the determined weight information,
determining the position of the magnetic field sensor from the weighted first position estimate and the weighted second position estimate,
obtaining motion data indicating motion of the magnetic field sensor, and
determining the temporal variation information from the obtained magnetic field sensor data and the obtained motion data by comparing the obtained magnetic field sensor data with expected magnetic field data determined from the obtained motion data and the magnetic map.

14. A non-transitory computer-readable recording medium that stores therein a computer program product, which, when executed by a processor, causes the position determination method according to claim 13 to be performed.

15. A mobile device comprising:
a magnetic field sensor for sensing magnetic field sensor data at a position of the mobile device,
measurement circuitry for acquiring measurement data allowing estimation of a position of the magnetic field sensor, and including a motion detector acquiring motion information indicating motion of the mobile device and/or an electromagnetic field detector for acquiring electromagnetic field data indicating an electromagnetic field, and a position determination device for determining the position of the magnetic field sensor based on the sensed magnetic field sensor data and the acquired measurement data, wherein said position determination device further comprises data input circuitry configured to obtain the magnetic field sensor data sensed by the magnetic field sensor, magnetic fingerprinting circuitry configured to determine a first position estimate of a position of the magnetic field sensor by comparing the obtained magnetic field sensor data with a magnetic map comprising magnetic fingerprints of a region around the magnetic field sensor and using temporal variation information, position estimation circuitry configured to determine a second position estimate of the position of the magnetic field sensor from the acquired measurement data, weight determination circuitry configured to determine weight information based on said temporal variation information, the determined weight information indicating a relative or absolute weight of the first position estimate and a relative or absolute weight of the second position estimate for determination of the position of the magnetic field sensor, wherein said weight determination circuitry is configured to decrease the relative or absolute weight of the first position estimate when the temporal variation information indicates temporal variations of a magnetic field are above a threshold, and position determination circuitry configured to weight the first position estimate and the second position estimate of the position of the magnetic field sensor according to the determined weight information, and to determine the position of the magnetic field sensor from the weighted first position estimate and the weighted second position estimate, wherein said weight determination circuitry is configured to determine the temporal variation information from the obtained magnetic field sensor data and the acquired motion information by comparing the obtained magnetic field sensor data with expected magnetic field data determined from the acquired motion information and the magnetic map.

16. The mobile device as claimed claim 15, wherein said mobile device is one of a handheld device, a wearable device, a mobile phone, a smartphone, a portable phone, a camera, a watch, a vital signs monitor, a laptop, a tablet, or a pair of glasses.

* * * * *